(12) United States Patent
Yamamoto

(10) Patent No.: US 7,792,503 B2
(45) Date of Patent: Sep. 7, 2010

(54) HIGH FREQUENCY MODULE

(75) Inventor: Fumio Yamamoto, Sano (JP)

(73) Assignee: Kabushiki Kaisha Toshiba, Tokyo (JP)

(*) Notice: Subject to any disclaimer, the term of this patent is extended or adjusted under 35 U.S.C. 154(b) by 834 days.

(21) Appl. No.: 11/535,329

(22) Filed: Sep. 26, 2006

(65) Prior Publication Data
US 2007/0232247 A1    Oct. 4, 2007

(30) Foreign Application Priority Data
Mar. 29, 2006    (JP) .............................. 2006-091548

(51) Int. Cl.
*H01Q 11/12* (2006.01)
(52) U.S. Cl. .................... 455/118; 455/226.1; 455/227; 455/326
(58) Field of Classification Search ................ 455/118, 455/226.1, 227.2, 260, 326, 403, 414.1, 333, 455/334, 341
See application file for complete search history.

(56) References Cited

U.S. PATENT DOCUMENTS

| 7,301,228 | B2 * | 11/2007 | Usui et al. | 257/698 |
| 7,330,080 | B1 * | 2/2008 | Stoiber et al. | 331/57 |
| 7,368,940 | B1 * | 5/2008 | Schultz | 326/38 |
| 2007/0152739 | A1 * | 7/2007 | Banerjee et al. | 327/538 |

FOREIGN PATENT DOCUMENTS

JP    2004-153368    5/2004

* cited by examiner

*Primary Examiner*—Yuwen Pan
(74) *Attorney, Agent, or Firm*—Oblon, Spivak, McClelland, Maier & Neustadt, L.L.P.

(57) ABSTRACT

A high frequency module includes: a line substrate having a first high-frequency signal line on a first surface thereof and a second high-frequency signal line on a second surface being a surface on the opposite side of the first surface, the second high-frequency signal line being electrically connected with the first high-frequency signal line; and a base substrate which is provided to the second surface of the line substrate, and which is formed in a manner that the base substrate is located away from the second high-frequency signal line.

12 Claims, 4 Drawing Sheets

| | EXAMPLE | COMPARATIVE EXAMPLE |
|---|---|---|
| PERMITTIVITY $\varepsilon_1$ OF LINE SUBSTRATE | 3.7 | 3.7 |
| THICKNESS t1 (mm) OF LINE SUBSTRATE | 0.64 | 0.64 |
| THICKNESS t2 (mm) OF AIR LAYER | 0.9 | - |
| WIDTH (mm) OF HIGH-FREQUENCY SIGNAL LINE | 2.2(=W2) | 1.298(=W1) |
| WIDTH (mm) OF GROUND CONDUCTOR | 3.6(=W3) | INFINITY |

HIGH FREQUENCY MODULE

CROSS REFERENCE OF THE RELATED APPLICATION

This application is based on and claims the benefit of priority from the prior Japanese Patent Application No. 2006-91548, filed on Mar. 29, 2006; the entire contents of which are incorporated herein by reference.

BACKGROUND OF THE INVENTION

1. Field of the Invention

The present invention relates to a high frequency module, and particularly to a high frequency module having a high-frequency signal lines through which high-frequency signals are transmitted.

2. Description of the Related Art

Recently, development of high frequency modules for high frequency waves, such as microwaves and milliwaves, have been in progress to deal with higher frequencies and higher output. As a result, the high frequency modules are mounted on an increasing variety of communication devices, and are widely used. In particular, the high frequency module is also used in a high output amplifier which is used in a mobile communication terminal device such as a cellular phone, and which is used in a base station as a power amplifier module having a substrate in which a matching circuit and a semiconductor element are integrated.

In such a high frequency module, a microstrip line is used in addition to various kinds of lines, such as a coplanar line and a coaxial line, as a high-frequency signal line which serves as a transmission line (refer to, for example, JP-A 2004-153368(KOKAI)). The microstrip line is mounted on a line substrate formed of a dielectric material, and is pulled out of the high frequency module using a lead wire. Also, the line substrate is mounted on a base substrate. Generally, the base substrate is made very thin, and has a thickness of about one tenth of the wavelength of the high-frequency signal so as to obtain good high frequency properties by preventing wrap-around of the high-frequency signal when the high-frequency signal passes the lead wire.

However, in general, the base substrate and the line substrate are joined to each other by surface contact (bimetal structure). For this reason, when the thickness of the base substrate is smaller, the mechanical strength of the base substrate is reduced. Thereby, the warpage of the base substrate occurs. In a case where the high frequency module is mounted on a heat release and grounding member for heat loss and grounding, this warpage causes a gap between the base substrate and the heat release and grounding member. Thereby, thermal resistance increases, and high frequency properties are deteriorated.

SUMMARY OF THE INVENTION

An object of the present invention is to provide a high frequency module with which a warpage of a base substrate can be suppressed while maintaining good high-frequency properties.

An aspect of embodiments of the present invention is that the high frequency module includes a line substrate which has a first high-frequency signal line on a first surface, and a second high-frequency signal line on a second surface which is a surface on the opposite side of the first surface, the second high-frequency signal line being electrically connected with the first frequency signal line, and a base substrate which is mounted on the second surface of the line substrate, and which is formed away from the second high-frequency signal line.

DETAILED DESCRIPTION OF THE PREFERRED EMBODIMENTS

First Embodiment

A first embodiment of the present invention will be described with reference to FIGS. 1 to 4.

Figure 1:
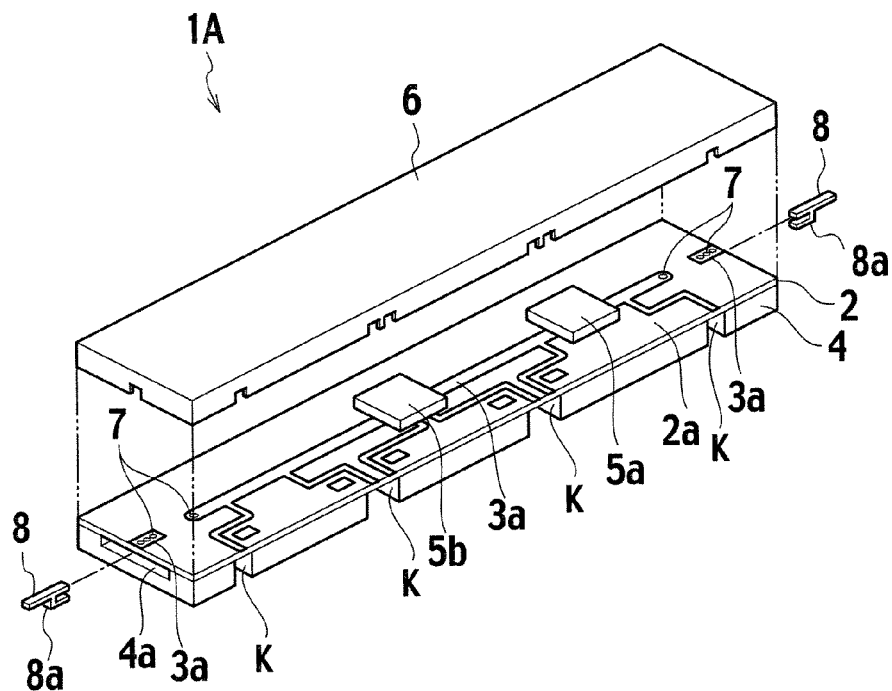
FIG. 1 is an exploded perspective view schematically showing a configuration of a high frequency module according to a first embodiment of the present invention.
Figure 2:
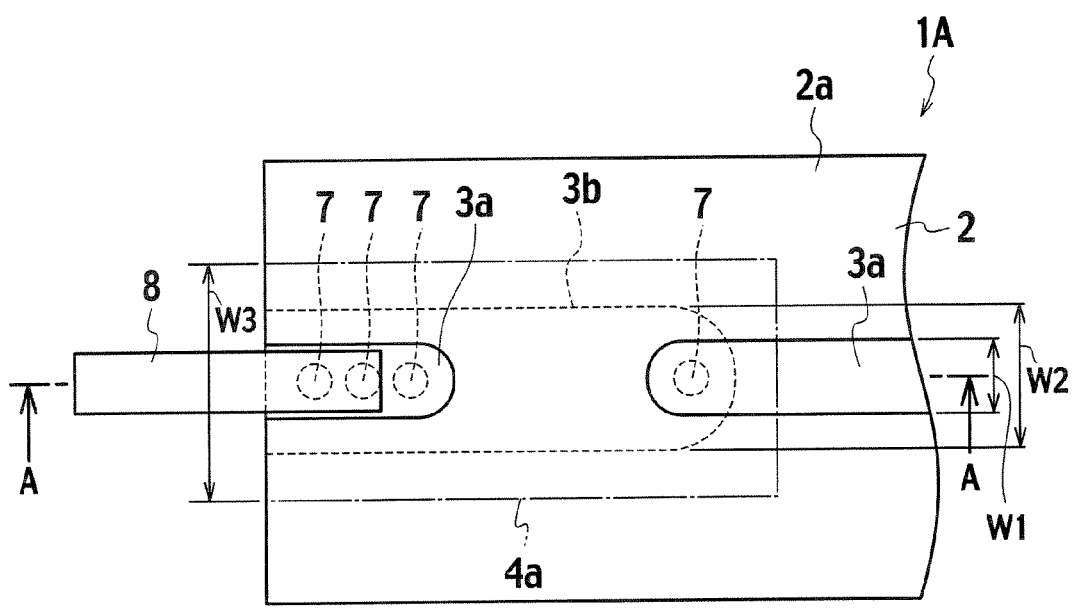
FIG. 2 is a plan view showing a part of the high frequency module of FIG. 1.
Figures 3, 4:
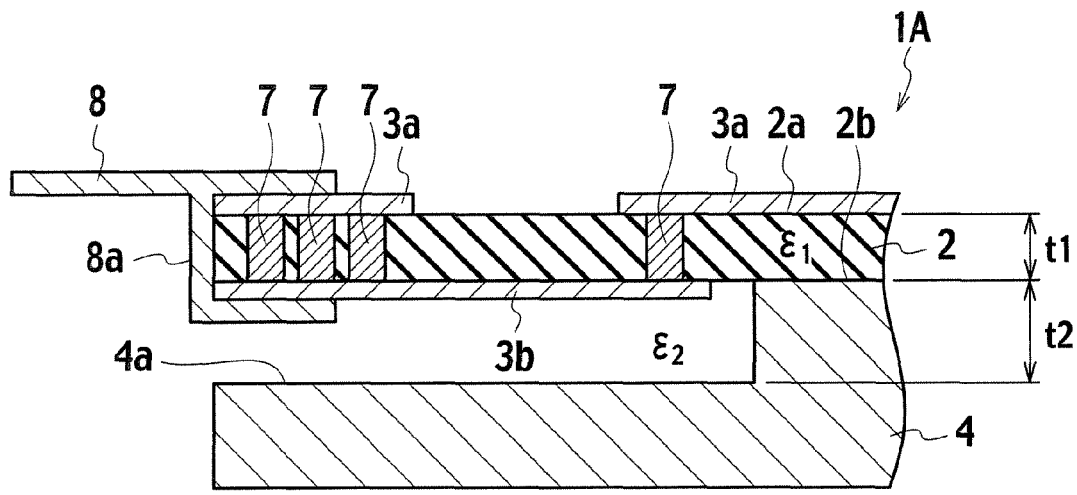
FIG. 3 is a cross-sectional view taken along the line A-A of FIG. 2.
FIG. 4 is an illustrative view showing various design values of the high frequency module in a case of setting characteristic impedance at 50Ω.

As shown in FIGS. 1 to 3, a high frequency module 1A according to the first embodiment of the present invention includes a line substrate 2 having a first high-frequency signal line 3a and a second high-frequency signal line 3b. The first high-frequency signal line 2a is on a first surface 2a, and the second high-frequency signal line 3b is on a second surface 2b (refer to FIG. 3) which is the surface on the opposite side of the first surface 2a, and is electrically connected to the first high-frequency signal line 3a; a base substrate 4 which is provided to the second surface 2b of the line substrate 2, and which is formed away from the second high-frequency signal line 3b; pre- and post-stage amplifiers 5a and 5b which are provided to the first surface 2a of the line substrate 2, and which are electrically connected to the first high-frequency signal line 3a; and a cover member 6 which are provided to the first surface 2a of the line substrate 2, and which covers various parts such as the first high-frequency signal line 3a and pre- and post-stage amplifiers 5a and 5b.

The line substrate 2 is a substrate which is formed of a dielectric having certain permittivity, and which is formed into a plate-like shape. The first high-frequency signal line 3a, which has a certain wiring pattern, is provided to the first surface 2a of the line substrate 2. The second high-frequency signal line 3b extending to an end of the line substrate 2 is provided to the back surface of the line substrate 2, the back surface being the second surface 2b.

The first high-frequency signal line 3a and the second high-frequency signal line 3b serve as a transmission line through which high-frequency signals are transmitted. The first high-frequency signal line 3a and the second high-frequency signal line 3b are connected to each other by way of a plurality of through-hole wirings 7 provided to the line substrate 2. At both ends of the line substrate 2, for example, three (any number is acceptable) through-hole wirings are lined and provided along the first high-frequency signal line 3a. This prevents a stub from being formed at both ends of the line substrate 2. The first high-frequency signal line 3a and the second high-frequency signal line 3b are formed of, for example, a copper film.

The first high-frequency signal line 3a is disposed from one side of the line substrate 2 toward the other side facing thereto via the pre- and post stage amplifiers 5a and 5b each provided to the first surface 2a of the line substrate 2. The pre- and post-stage amplifiers 5a and 5b are respectively amplifiers which amplify the high-frequency signals transmitted through the first high-frequency signal line 3a. Particularly, the pre-stage amplifier 5a is an amplifier which supplies a rated input to the post-stage amplifier 5b. The cover member 6, which covers the first high-frequency signal line 3a and pre- and post-stage amplifiers 5a and 5b, is formed in a box-like shape, and is provided over the first surface 2a of the line substrate 2 to protect the respective kinds of parts provided to the first surface 2a. Furthermore, the cover member 6 functions as an oscillation prevention shield.

Lead portions 8 are removably provided to the line substrate 2 to pull the first high-frequency signal line 3a and the second high-frequency signal line 3b out of the high frequency module 1A. The lead portions 8 respectively have arm portions 8a to hold the line substrate 2, and are attached to the line substrate 2 with which the line substrate 2, along with the first high-frequency signal line 3a and the second high-frequency signal line 3b, is interposed and held between the arm portions 8a. In this event, the lead portions 8 are electrically connected with the first high-frequency signal line 3a and the second high-frequency signal line 3b. The holding power of the arm portions 8a is caused by the resilient force of the arm sections 8a.

The base substrate 4, which is formed into a plate-like shape, is provided to the back surface of the line substrate 2, the back surface being the second surface 2b. The base substrate 4 is formed of a material having high heat dissipation characteristics, such as copper, in a way that the base substrate 4 is located away from the second high-frequency signal line 3b. That is, a concave part 4a is provided to the base substrate 4. The concave part 4a faces the second high-frequency signal line 3b, and is located away from the second high-frequency signal line 3b. Thus, in a case where the base substrate 4 is provided to the second surface 2b of the line substrate 2, the base substrate 4 is prevented from contacting with the second high-frequency signal line 3b. The concave part 4a is provided at both ends of the base substrate 4. The base substrate 4 is provided with a notch part K facing the first high-frequency signal line 3a with the line substrate 2 interposed in between. The notch part K is provided at the side of the base substrate 4.

The concave part 4a is formed by removing a part of the base substrate 4, the part having a region larger than the second high-frequency signal line 3b, the region including a region which faces the second high-frequency signal line 3b. The concave part 4a provides a space between the second high-frequency signal line 3b and the base substrate 4. This space is filled with air, and an air layer is formed therein.

As described above, according to the first embodiment of the present invention, the second high-frequency signal line 3b is provided on the second surface 2b of the line substrate 2, and the base substrate 4 is formed in a way that the base substrate 4 is located away from the second high-frequency signal line on the second substrate 2b. Thereby, a thickness of a part of the base substrate, the part facing the second high-frequency signal line 3b, is made smaller. Thus, it is made possible to prevent wraparound of the high-frequency signals when the high-frequency signals pass the lead section. In addition, the thickness of the part of the base substrate 4 other than the part facing the second high-frequency signal line 3b can be increased, and the mechanical strength of the base substrate 4 can be increased. Accordingly, the warpage of the base substrate 4 can be prevented while maintaining good high-frequency properties.

As a result, even when the high frequency module 1A is provided to the heat release and grounding member for heat loss and grounding, the gap is prevented from being formed between the base substrate 4 and the heat release and grounding member. Hence, increase in thermal resistance can be prevented, and the grounding can be made reliably. Thus, the deterioration of high frequency properties can be prevented.

The base substrate 4 includes a concave part 4a which faces the second high-frequency signal line 3b, and which is located away therefrom. Thereby, with a simple constitution, wraparound of the high-frequency signals can be prevented when the high-frequency signals pass the lead portions 8. Furthermore, the base substrate 4 can be easily formed in a manner that the base substrate 2 is located away from the second high-frequency signal line 3b.

In this event, as shown in FIG. 2, the width of the first high-frequency signal line 3a is indicated as W1, the width of the second high-frequency signal line 3b as W2, and the width of the concave section 4a as W3. As shown in FIG. 3, permittivity of the line substrate 2 is indicated as $\in 1$, permittivity of air as $\in 2$, the thickness of the line substrate 2 as t1, and the depth of the concave part 4a, i.e., the thickness of the air layer as t2. In this case, when the high frequency module 1A is designed with characteristic impedance set at 50Ω, various kinds of design values are obtained as those of Example shown in FIG. 4. In Comparative Example shown in FIG. 4, used was the high frequency module which included a line substrate 2 having only the first high-frequency signal line 3a as a microstrip line.

As shown in FIG. 4, in Example, the width W2 of a high-frequency signal line (the second high-frequency signal line 3b) was 2.2 mm. In Comparative Example, the width W1 of the high-frequency signal line (the first high-frequency signal line 3a) was 1.298 mm. Furthermore, in Example, the width of a ground conductor was the width W3 of the concave part 4a, and was 3.6 mm. In Comparative Example, the width of a ground conductor (the width of the base substrate 4) was infinite. Thus, with the high frequency module 1A, a high-frequency signal line can be designed to have a width larger than that of the microstrip line. Thereby, the allowable current of a connector part can be increased. In addition, the attaching strength of the lead portions 8 can be increased. Moreover, the width of the ground conductor can be reduced by the width t2 of the air layer, and good high-frequency properties can be obtained.

Second Embodiment

A second embodiment of the present invention will be described with reference to FIGS. 5 and 6.

In the second embodiment, different parts from those of the first embodiment will be described. The identical reference numerals are used to designate the identical or similar components, the descriptions of which will be omitted.

Figure 5:
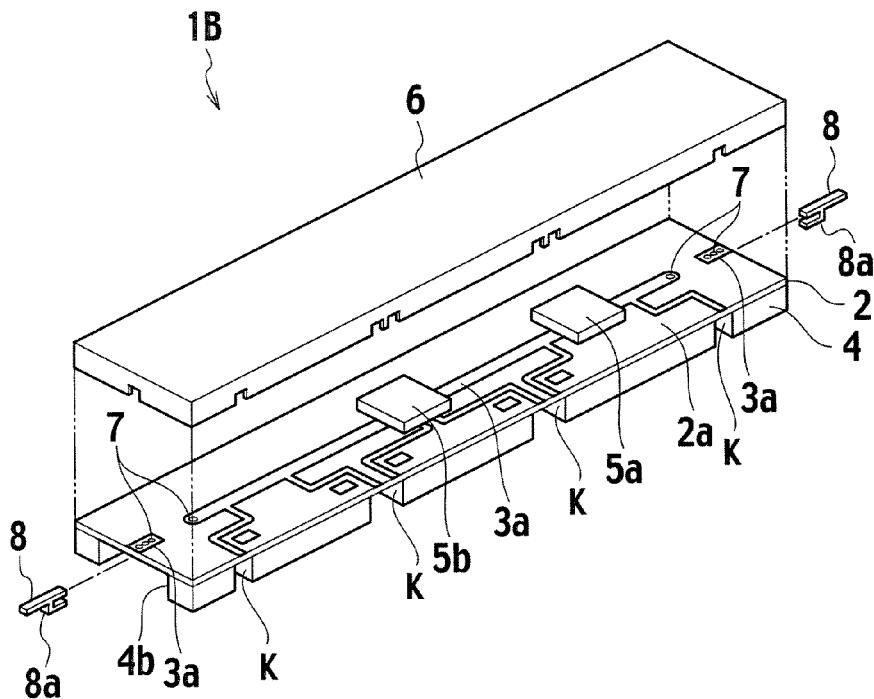
FIG. 5 is an exploded perspective view schematically showing a configuration of a high frequency module according to a second embodiment of the present invention.
Figure 6:
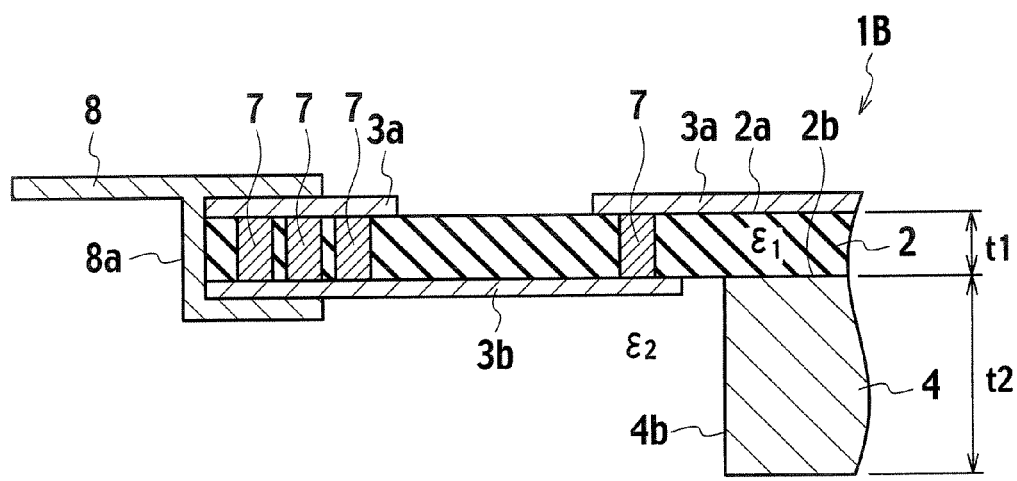
FIG. 6 is a cross-sectional view showing a part of the high frequency module of FIG. 5.

As shown in FIGS. 5 and 6, a base substrate 4 included in a high frequency module 1B of the second embodiment is provided with a notch part 4b, which is located away from the second high-frequency signal line 3b, in place of the concave part 4a in the first embodiment. Thereby, in a case where the base substrate 4 is provided to the second surface 2b of the line substrate 2, the base substrate 4 can be prevented from contacting with the second high-frequency signal line 3b.

The notch part 4b is formed by notching a part of the base substrate 4, the part having a region larger than the second high-frequency signal line 3b, the region including a region which faces the second high-frequency signal line 3b. Because of the presence of the notch part 4b, a portion of the base substrate 4 in a position, which faces the second high-frequency line 3b, does not exist.

As described above, in the second embodiment of the present invention, a similar effect as that of the first embodiment can be obtained. In particular, by providing the notch part 4b to the base substrate 4, the base substrate 4 does not exist in the position facing the second high-frequency signal line 3b. Thereby, as compared to the first embodiment, wraparound of the high-frequency signals can be prevented more reliably when the high-frequency signals pass the lead portions 8.

Incidentally, since the base substrate 4 includes the notch part 4b formed away from the second high-frequency signal line 3b, with a simple constitution, wraparound of the high-frequency signals can be prevented when the high-frequency signals pass the lead portions 8. Furthermore, the base substrate 4 can be easily formed in a manner that the base substrate 4 is located away from the second high-frequency signal line 3b.

Third Embodiment

A third embodiment of the present invention will be described with reference to FIG. 7.

In the third embodiment, different parts from those of the first embodiment will be described. The identical reference numerals are used to designate the identical or similar components, the descriptions of which will be omitted.

Figure 7:
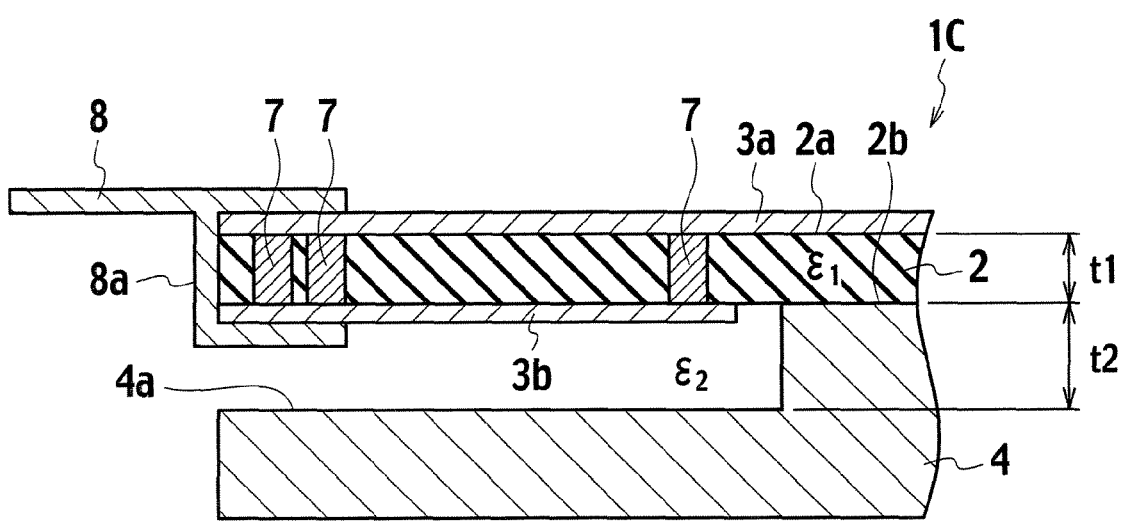
FIG. 7 is a cross-sectional view showing a part of a high frequency module according to a third embodiment of the present invention.

As shown in FIG. 7, on the first surface 2a of the line substrate 2 included in a high frequency module 1C according to the third embodiment, the first high-frequency signal line 3a is extended without being cut at a position facing the second high-frequency signal line 3b, and is provided in a manner that the first high-frequency signal line 3a faces the second high-frequency signal line 3b. That is, the first high-frequency signal line 3a is provided in a manner that the first high-frequency signal line 3a extends, by way of the pre-stage and post-stage amplifiers 5a and 5b, from one end of the line substrate 2 to the other end facing thereto.

As described above, in the third embodiment of the present invention, a similar effect as that of the first embodiment can be obtained.

Other Embodiments

The present invention is not limited to the above embodiments, and various modifications can be made without departing from the spirit and scope of the present invention.

For example, in the above embodiments, various kinds of values have been described. However, the values are merely illustrative, and not restrictive.

What is claimed is:

1. A high frequency module comprising:
a line substrate having a first high-frequency signal line on a first surface, and a second high-frequency signal line on a second surface being a surface on the opposite side of the first surface, the second high-frequency signal line being electrically connected to the first high-frequency signal line; and
a base substrate which is provided to the second surface of the line substrate, and which is formed in a manner that the base substrate is located away from the second high-frequency signal line,
wherein the first high-frequency signal line and the base substrate provide a first micro-strip line part,
the second high-frequency signal line and the base substrate provide a second micro-strip line part, and
impedance of the first micro-strip line part is the same as impedance of the second micro-strip line part.

2. The high frequency module according to claim 1, wherein width of the second high-frequency signal line is larger than width of the first high-frequency signal line in order to match impedance of the first micro-strip line part and the second micro-strip line part.

3. The high frequency module according to claim 1, wherein the base substrate of the second micro-strip line part is thinner than the base substrate of the first micro-strip line part in order to match impedance of the first micro-strip line part and the second micro-strip line part.

4. The high frequency module according to claim 1, wherein width of the second high-frequency signal line is larger than width of the first high-frequency signal line and thickness of the base substrate of the first micro-strip line part is set in order to match impedance of the first micro-strip line part and the second micro-strip line part.

5. The high frequency module according to claim 1, wherein the base substrate includes a concave part which keeps the base substrate of the second micro-strip line part away from the second high-frequency signal line.

6. The high frequency module according to claim 5, wherein
the concave part provides a space between the second high-frequency signal line and the base substrate of the second micro-strip line part, and the space is filled with air.

7. A high frequency module comprising:
a line substrate having a first high-frequency signal line on a first surface, and a second high-frequency signal line on a second surface being a surface on the opposite side of the first surface, the second high-frequency signal line being electrically connected to the first high-frequency signal line; and
a base substrate which is provided to the second surface of the line substrate, and which is formed in a manner that the base substrate is located away from the second high-frequency signal line,
wherein the first high-frequency signal line and the base substrate provide a first micro-strip line part, and
when the second high-frequency signal line and a virtual surface including the opposing surface of the base substrate provide a second micro-strip line part, width of the second high-frequency signal line is set in order to match impedance of the first micro-strip line part and the second micro-strip line part.

8. The high frequency module according to claim 7, wherein width of the second high-frequency signal line is larger than width of the first high-frequency signal line in order to match impedance of the first micro-strip line part and the second micro-strip line part.

9. The high frequency module according to claim 7, wherein thickness of the base substrate of the first micro-strip line part is set in order to match impedance of the first micro-strip line part and the second micro-strip line part.

10. The high frequency module according to claim 7, wherein width of the second high-frequency signal line is larger than width of the first high-frequency signal line and thickness of the base substrate of the first micro-strip line part is set in order to match impedance of the first micro-strip line part and the second micro-strip line part.

11. The high frequency module according to claim 7, wherein the base substrate includes a notch part which keeps the base substrate away from the second high-frequency signal line.

12. The high frequency module according to claim 11, wherein the notch part provides a space between the second high-frequency signal line and the virtual surface, and the space is filled with air.

* * * * *